United States Patent [19]

Robbins et al.

[11] 4,321,667
[45] Mar. 23, 1982

[54] ADD-ON PROGRAMS WITH CODE VERIFICATION AND CONTROL

[75] Inventors: Wayne E. Robbins, Longmont, Colo.; Paul R. Spivey, Winchester, Ky.; Terence Travis, Boulder, Colo.

[73] Assignee: International Business Machines Corp., Armonk, N.Y.

[21] Appl. No.: 89,799

[22] Filed: Oct. 31, 1979

[51] Int. Cl.³ .............................................. G06F 13/06
[52] U.S. Cl. ................................................... 364/200
[58] Field of Search ..................... 364/200 MS File; 371/19

[56] References Cited

U.S. PATENT DOCUMENTS

| | | |
|---|---|---|
| 3,579,199 | 5/1971 | Anderson et al. |
| 3,815,103 | 6/1974 | Holtey et al. |
| 3,821,715 | 6/1974 | Hoff, Jr. et al. ..................... 364/200 |
| 3,838,264 | 9/1974 | Maker |
| 3,972,028 | 7/1976 | Weber et al. ..................... 364/200 |
| 4,122,996 | 10/1978 | Wilczek |
| 4,161,277 | 7/1979 | Steiner |
| 4,209,846 | 6/1980 | Seppa ..................... 364/900 |

OTHER PUBLICATIONS

Crandall et al., "Dynamic Self—Checking for a Read—Only Storage", IBM Tech. Discl. Bull., vol. 19 No. 8, Jan. 1977, pp. 2868-2869.

*Primary Examiner*—Gareth D. Shaw
*Assistant Examiner*—Thomas M. Heckler
*Attorney, Agent, or Firm*—Carl M. Wright

[57] ABSTRACT

Expandable memory system having add-on modules beginning at fixed address boundaries, e.g., 2K (K=1024), and having verification and authorization features. A non-volatile memory stores a bit corresponding to each 2K memory boundary. When an add-on program is authorized at a particular boundary address, the corresponding bit is set. The base program checks each bit and, if it is set, reads the first location of the corresponding add-on program. If the data read from the new module matches some reference, e.g., the boundary address itself, then program control branches to the add-on program. Additional verification features include cyclic redundancy checks of the added code. Alternative operation includes branching to a verified add-on program that tests its own authorization bit which, if reset, causes a branch to the next verified add-on program, and so on.

8 Claims, 6 Drawing Figures

ADD-ON PROGRAMS WITH CODE VERIFICATION AND CONTROL

BACKGROUND OF THE INVENTION

This invention relates to memory systems and, in particular, to memory systems for adding new code to existing base programs.

It is often desirable to expand a program system stored in memories, especially read-only memories, but the fact that a program is fixed raises several problems, among them being those created by requiring a specific address to branch to the new programs, activating and authorizing the added program, validating the new code, and providing for execution of the new code.

Since branching to the new program requires a specific address, the addresses could be stored but this would require using a non-volatile memory space which is limited and expensive. There is also the possibility that, due to human error, wrong addresses could be entered.

The activation and authorization of the added programs are necessary because the new code may not always be required or authorized. It is not desirable to add and to remove memory modules periodically. Furthermore, memory failures could cause the appearance of no program at all.

It is also desirable to be able to validate the new code to ensure before its execution that it is the proper code in the proper place.

The execution of the new code raises problems in determining the branch and link time because excessive branch and link calls can increase the size of the base program unnecessarily as well as increase the number of flags and entry points required for return. On the other hand, too few branch and link calls makes the new code ineffective by being executed too infrequently and decreases the flexibility desired to be obtained by adding the new program.

This invention discloses a system for adding memory without having to alter the base program extensively while avoiding the problems mentioned above.

SUMMARY OF THE INVENTION

A method for adding memory modules to an expandable memory system with a writeable storage means having a control bus for conducting control signals and a data bus and an address bus for conducting data signals and address signals, respectively, includes establishing a certain value for each boundary address of the added memory modules and coupling each of the added memory modules to the busses. Each memory module has at a given location a stored reference value and the writeable storage stores a validity signal corresponding to each memory module in the system. A program is executed in the added memory module by first checking the validity signals to determine whether the added module is active and then reading the stored reference value from the given storage location of the added memory module to be compared to a given reference value. Program control is transferred to the added memory module if the stored reference value is equal to the given reference value. The program in the added memory module returns program control to the calling program when completed.

DETAILED DESCRIPTION

Figure 1:
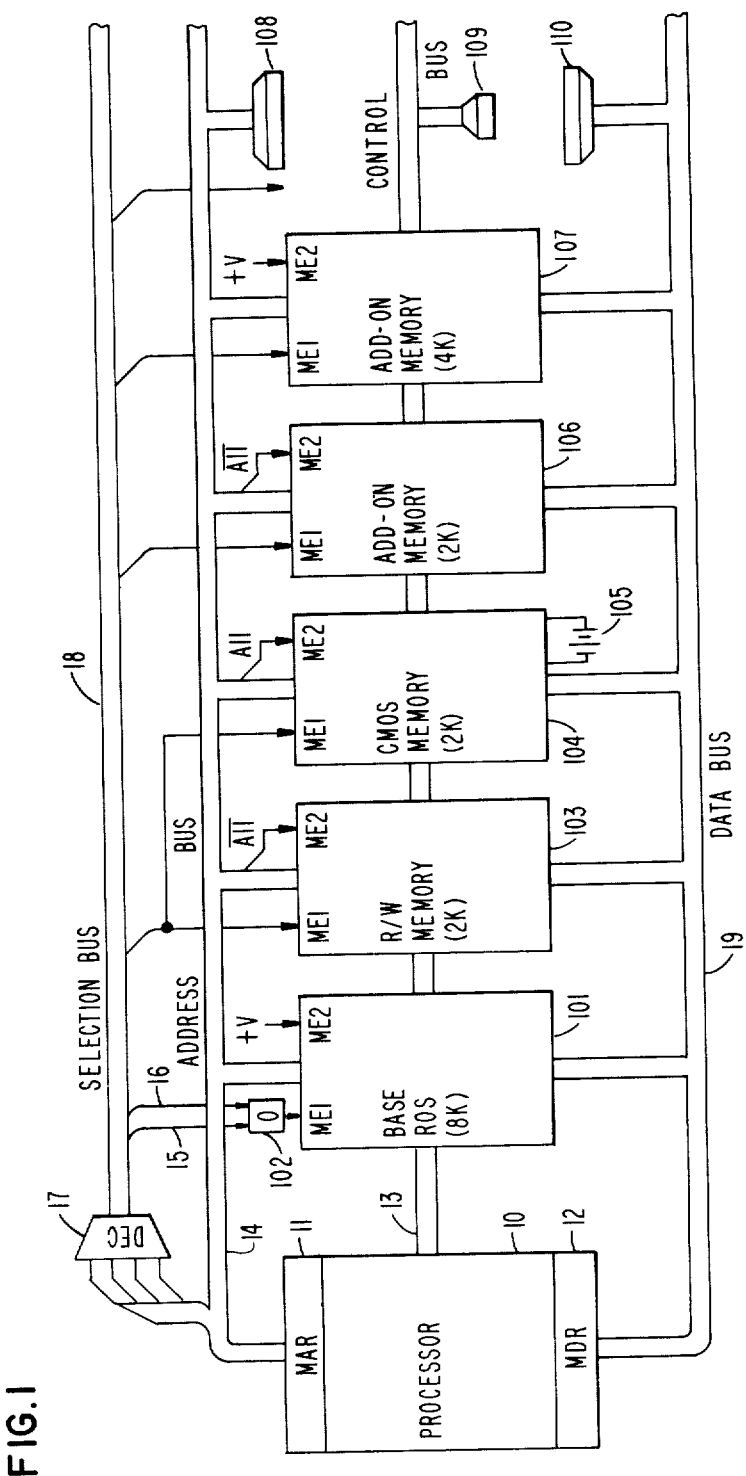
FIG. 1 is a block diagram of a memory system in which the invention may be used.

In FIG. 1 a system for practicing the invention is shown. A processor 10 has a memory address register 11 and a memory data register 12. The memory address register furnishes a number of bits to an address bus 14, consisting typically of sixteen bits or lines, viz., $2^0$ to $2^{15}$. (See exponentiation in the Appendix.) In the system of FIG. 1, the four most significant bits, $2^{12}$ to $2^{15}$, are coupled to a decoder 17. The output from the decoder is a selection bus 18 comprising sixteen lines. Only one of the lines on the selection bus can be active at a given time due to the action of the decoder 17 which is well known in the art.

The remaining twelve address bits are coupled to individual memory arrays in parallel.

A data bus 19, consisting typically of an eight-bit byte, is coupled to the memory data register 12 of the processor. The data bus 19 is coupled in parallel to each of the memory arrays for reading data or for furnishing data to be written into the writeable memories. A control bus 13 is also provided which transmits to each of the memory arrays signals such as Read/Write, timing signals, and the like. The control bus 13 is also coupled to each memory array in parallel.

The twelve least significant bits of the address bus are capable of selecting one out of 4,096 memory locations. (Hereinafter, the letter K will be used to represent 1,024 vice 1,000 so that 4,096 is written 4K.)

A base Read Only Storage 101 is shown as having 8K locations. Therefore, two select lines 15 and 16 are coupled to an OR gate 102 which furnishes a memory enable signal. Each memory array is shown as having two memory enable input terminals. In the system being described, both Memory Enable 1 (ME1) and 2 (ME2) must receive a high signal for the associated memroy to be enabled. (Many commercially available memory arrays are constructed so that one enabling input must be high and the other enabling input must be low in order for the memory array to be enabled.) The second memory enable terminal, ME2, of memory array 101 is coupled to a high voltage since it is not required for selection of the memory. Each line of the selection bus 18 selects a particular 4K address group depending on the four most significant digits of the sixteen-bit address. Therefore, to enable the 8K memory, two 4K selection lines are required.

A memory array 103 in FIG. 1 is shown as a Read/Write memory having 2K locations. Because only eleven lines are required to select a specific one of the 2K memory locations, only $2^0$ through $2^{10}$ may be coupled to the address inputs of the array 103. To select the memory array 103, its ME2 terminal is coupled to the $2^{11}$ ($\overline{A11}$) address inverted bus. (It is assumed that both the true and the inverted signals are available from the address bus.)

A second 2K memory array 104, shown as a CMOS non-volatile memory (being powered by battery 105 in case of power loss) is coupled to the same line from the selection bus 18 as the memory array 103. The terminal ME2 of the memory array 104, however, is coupled to the 2'11 (A11) address normal line instead of the inverted line. As a result, the 4K represented by both the memory array 103 and the memory array 104 are selected by a particular selection line from the selection bus 18 but the individual array is selected by the state of the 2'11 (A11) bit of the address.

An Add-On memory array 106 having a capacity of 2K storage locations is shown as coupled to a fourth line from the selection bus 18 with its second memory enabling terminal coupled to the 2'11 bit inverted. A second Add-On memory 107 having 4K locations is coupled to a different line from the selection bus 18 with its second enabling terminal coupled to an enabling positive voltage. Because it has a 4K capacity, only the output line from the selection bus 18 is required to select the memory array 107. In the event that a second 2K capacity memory array is added, the same selection line from the bus 18 coupled to the first enabling terminal of the array 106 can be used as the input to the ME1 terminal of the new array and the ME2 terminal would be coupled to the 2'11 normal bit.

Provision is made for coupling additional memory arrays as shown by the plugs 108, 109, and 110 for coupling a new array to the address bus, control bus, and data bus, respectively. A selection line from the selection bus 18 is also provided. It is assumed that additional provisions are made for further add-on memory array.

FIG. 1, therefore, shows how an expandable memory system can be constructed for use with the present invention.

In the CMOS memory 104 of FIG. 1, memory space is usually limited so that adding new memory modules must use as little memory as possible. It is also desirable that the addition of new modules require as little extra programming in the main program as possible.

Figure 2:
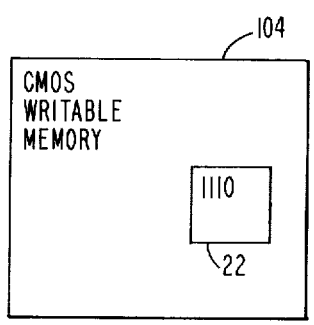
FIG. 2 is a map of a writeable memory showing a validity table.

FIG. 2 shows a partial map of the CMOS writeable memory 104 including a memory table 22. This table is used to store a bit corresponding to each memory add-on module usable with the system. In the following description, it is assumed that a bit is stored for each 2K memory module. Alternatively, however, the table may contain the starting addresses of each add-on memory module, but this would require more than an additional magnitude of storage space. For example, an address comprising sixteen bits would require two bytes per add-on memory module whereas using a bit per module requires only one byte for eight modules.

In the table, if an added module is active or authorized, its corresponding bit is set and if the program in the corresponding add-on module is not authorized or activated, the bit is reset. If addresses were stored, a non-zero address would indicate an authorized add-on memory module. An example of an add-on program is a program required for control of a copier feature in a processor controlled copy machine. A feature is not authorized if the customer decides not to elect, i.e., not to pay for, the feature.

To save space in the CMOS writeable memory 104, the addresses required to transfer to the add-on program are calculated as will be described in detail below.

Figure 3:
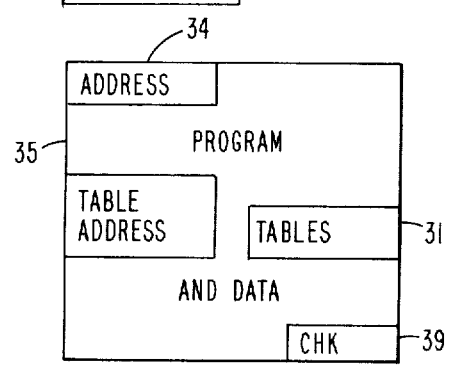
FIG. 3 is a memory map of an added memory module.

FIG. 3 is a memory map of an add-on module showing that the first location stores the first address of the module itself. In the general case, any reference value may be stored at any predetermined address within the program module. If the program module is to contain tables, the table address can be stored at a predetermined offset or displacement from the first address to permit access to the table by a user program. This will be described in more detail below.

A check character is also stored to provide another level of verification of the memory module. A check character can be a cyclic redundancy check, a modulo-N residue counter, or a block parity character. These types of check characters are well known in the art. For the residue counter, the verifying program adds the value in each storage location as if it were a binary number, retaining only the number of bits equal to the number of bits in the storage location, usually eight. At the end of the count, the eight-bit value represents the residue or remainder after dividing the sum of all of the storage locations by 256. Therefore, adding all the storage locations except the check character should produce the check character which can be compared to the derived remainder to verify the validity of the code in the added program. Similarly, a modulo-2 counter can be used for each bit in the byte of each storage location and each byte is applied to the modulo-2 counters so that when the check character is reached, the parity bits correspond to the check character. This can also be done by exclusive-ORing each byte, including the check character, successively into an accumulator. A zero result verifies the code. As noted above, these systems are well known in the art and need not be explained in greater detail.

Although shown in FIG. 3 as an indeterminate number of characters or bytes at the end of the memory, the CRC or other check characters can be placed at any location within the module. The only limitation is that the character check, as well as the other reference characters, be at a fixed location or at a location defined by a fixed pointer. In one embodiment, the first seven bytes of an add-on module were organized as XX CCCC PPPP QQQQ where XX are the high order hexadecimal digits of the address (the low order always being zero), CCCC are four hexadecimal digits (two bytes) comprising a CRC check character, and PPPP and QQQQ are two two-byte pointers for tables and the like.

Figure 4:
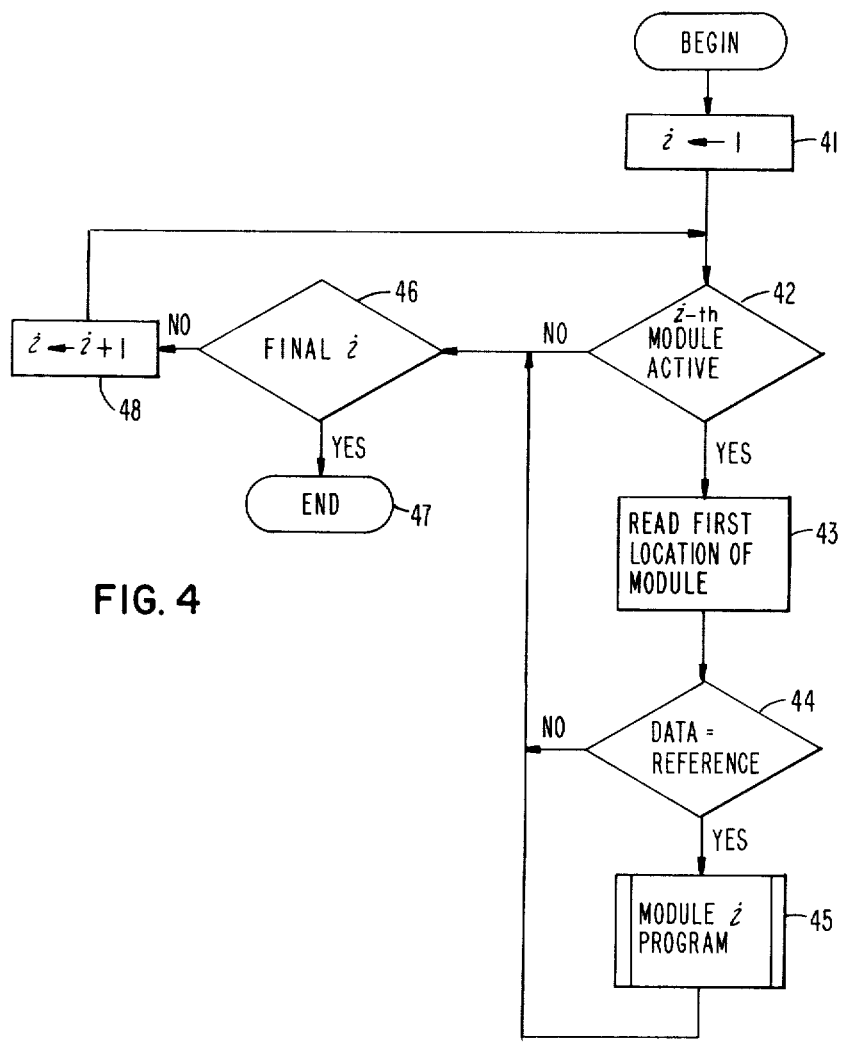
FIG. 4 is a flowchart of a program for practicing the method of the invention.

In FIG. 4, a flowchart for a program to practice the invention is shown as an in-line process in that it has a beginning and an end, rather than a call and a return, as terminal nodes. The table in the CMOS writeable memory constitutes a Boolean array, the location of which is considered global to the processes to be described herein. The initial step 41 sets a pointer i to the value of one. Next, at step 42, the i-th array value is checked. As noted above, this may be a bit or sixteen bits. The check performed by the step 42 determines whether the i-th array entry is zero. If it is not zero, the corresponding module is to be cosidered to be active, causing step 43 to be performed which reads the first location in the i-th module. The data read is compared to a reference value. In the embodiment being described, the data and the reference are the first address location of the particular memory module. If these values are equal at the step 44, a call (branch-and-link) to the i-th program is performed and the i-th program is executed as indicated at the step 45. The add-on programs are provided with a RE- TURN so that program control is restored to the instruction following the calling instruction.

The end of the i-th add-on program causes a return to a step 46 which determines whether the last entry in the array table has been checked. If so, the program ends as indicated by the terminal 47. If not, one is added to the value of the pointer i and the servicing program resumes at the step 42. If the entry in the array indicates at the step 42 that the added program is not active or if at step 44, that the data read does not match the reference data, then the final check step 46 is performed, skipping the execution of the i-th module program.

Two verification subroutines are shown below in Algol language for performing the validity checks. The first, VERS, checks the first location of the appropriate module to determine whether the address stored therein is equal to the address of the module. If so, a verification bit, V, is set. If not, V is reset and the subroutine returns to the calling program.

The other, VER, not only checks the first location for the correct reference value but performs a verification check illustrated here as the residue check. That is, the values in the memory locations are added modulo-256 and the sum (residue) checked against the last (check) character of the module. The verification bit, V, is set if they are equal. Otherwise, it is reset.

These verification routines are used in the programs described below.

```
proc.  VERS(j,V) integer j; Boolean V;
       V:=if #(j * 2'11 + 3 * 2'12)=
       (j * 2'11 + 3 * 2'12)
       then true else false
end    VERS proc.  VER(j,V) integer j,k,MODSUM,p; Boolean V;
       k:=j * 2'11 + 3 * 2'12;
       if #(k) ≠ k then begin V:=false; return end
       MODSUM:=0;
       for p:=k step 1 until k + 2'12 −1 do
           MODSUM:=rem((MODSUM + #(p)), 2');
       V:=if #(p+1) = MODSUM then true else false
end    VER
```

An Algol program is shown below for performing the program steps illustrated in FIG. 4. The Appendix attached hereto lists the transliterations from the standard Algol 60 used in the explanation of the invention. In the program, the Boolean array A (CMOS table) is shown outside the procedure to indicate that the array is global to the procedure as is the value of n, an integer. A for statement is performed for values of i running from one through n, inclusively. This for statement performs the steps 41, 46 and 48 in FIG. 4. The go to value is a conditional statement indicating that if the i-th element of the array A is true (the i-th bit set), then the program transfers to an absolute address as indicated by the # calculated by the example expression. This example expression is illustrative of the calculation to be made for the system of FIG. 1. As seen in FIG. 1, the memory has fixed modules accounting for 12K locations. Therefore, the add-on memory location are 2K steps beginning after 12K (12,288). The 2'11 value (2K) is multiplied by the i value and added to three times 2'12 which points the go to statement to the first address of the i-th module. The 2'11 value provides the 2K boundary increments and 3*2'12 provides the 12K offset occasioned by the first 12K fixed locations.

```
Boolean array A[1:n]
...
proc. CHKRUN (A,n) integer i; Boolean V;
      for i:=1 step 1 until n do
          if A[i] then begin
              vers(i,V);
              go to if −V then return else
              #(i * 2'11 + 3 * 2'12)
          end
end CHKRUN
```

Figure 5:
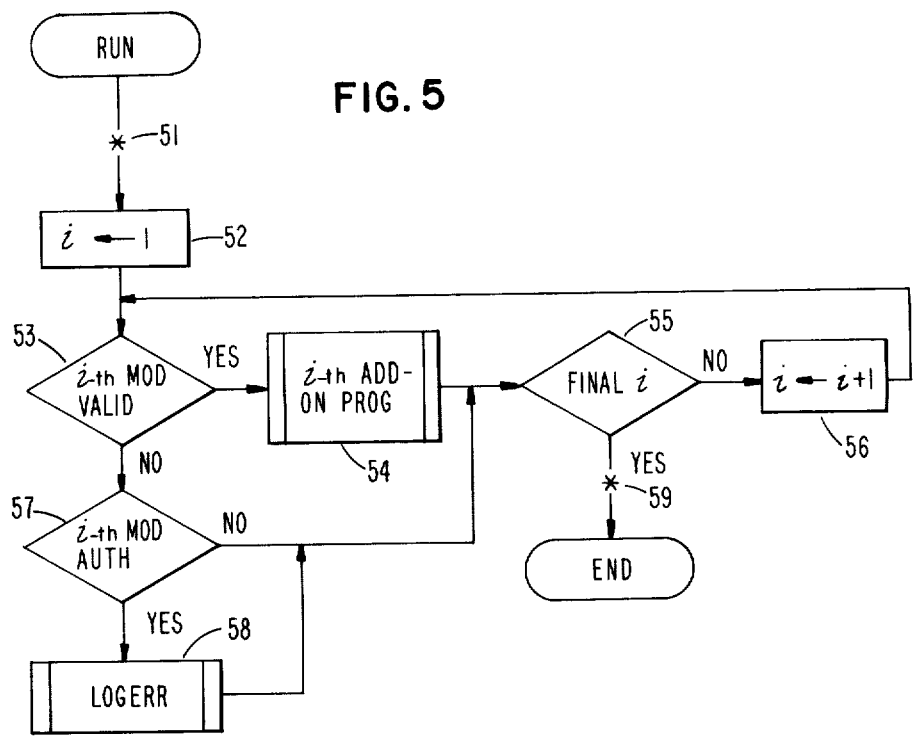
FIG. 5 is a flowchart of another method for practicing the invention.

The flowchart of FIG. 5 shows an alternate implementation of the invention in a flowchart of a portion of a larger program. The asterisk 51 indicates other programming not related to the invention. This program is illustrated as part of a RUN program which operates a machine such as a copier in which the add-on programs might be used. The other coding 51 is followed by setting pointer i to one by the step 52. The step 53 checks whether the i-th module is valid. This may comprise several tests. In this illustration, the i-th module is considered valid if the first storage location thereof is equal to its address plus a verification of the code by one of the means described above, e.g., cyclic redundancy check, block parity check, residue counter, or the like. If the tests prove that the i-th module is valid and verified, then the i-th add-on program is called as shown at the step 54.

The i-th add-on program called by the calling program has in the first part of its coding a routine to check the authorization bit in the CMOS memory. If the program finds that its authorization bit is not set, it returns immediately to the calling program. If the authorization bit is set, the program is run and control returns to the calling program where, at the step 55, a check is made to determine wheter this is the last add-on program. If not, the pointer i is incremented at the step 56 and the above-described sequence is repeated.

At the step 53, if the i-th module is found to be invalid, its authorization bit is checked by the step 57. If the authorization bit is not set, the program looks at the next add-on module by the steps 55 and 56. If the i-th module is authorized, then a log error (logerr) routine is called as shown at the step 58. This stores an indication that an invalid code existed where a valid code should have been.

After the step 55 determines that all the programs have been tested or run, the program continues with other coding 59. The following Algol program shows the details for a program to execute the steps shown in FIG. 5.

As in the previous program, the Boolean array A is global to the program. Again, the for statement accomplishes the handling of the pointer as shown in the steps 52, 55 and 56. The Verify subroutine as explained above is called to set the value of the Boolean variable V.

```
Boolean array A[1:n] . . .
...
proc. VRUN (A,n) integer i; Boolean V;
      for i:=1 step 1 until n do
          begin ver(i,V);
          go to if V then #(i * 2'11 + 3 * 2'12)
          else
          if A[i] then logerr(i) end
end VRUN
```

The called program, shown below as ADDON-PROGi, has as one of its first statements, the test of its authorization bit which, if not set, causes a return to the calling program.

```
Boolean array A[1;n]
  . . .
  proc ADDONPROGi . . .
    if −A[i] then return
  . . .
```

The LOGERR(i) subroutine is not shown in detail. It is only ancillary to the invention and, in effect, merely stores the value i at a particular location to record the fact that the i-th program module was faulty. Such a subroutine is within the ordinary skill of the art.

Figure 6:
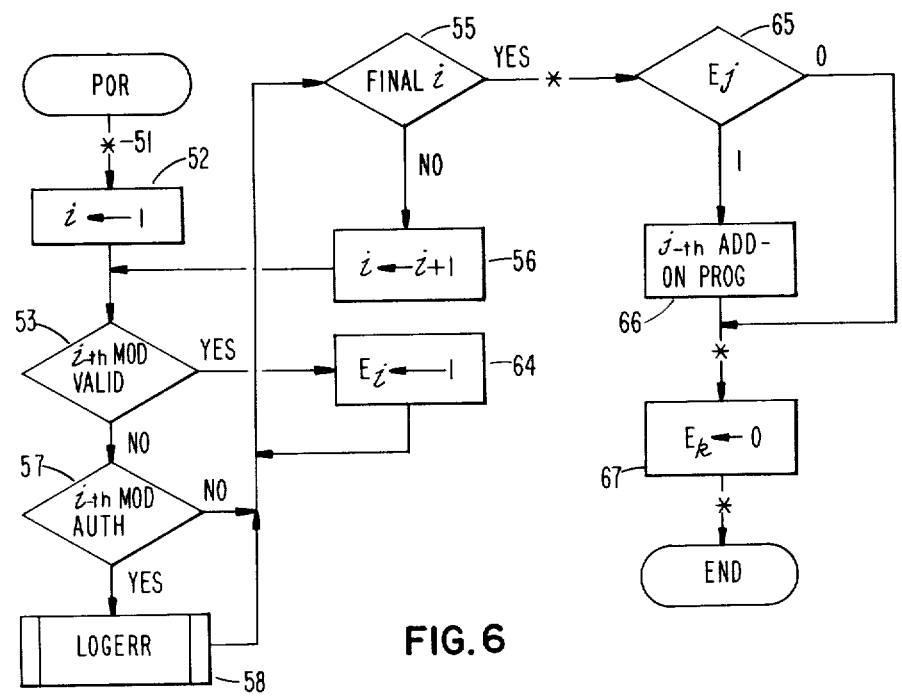
FIG. 6 is a portion of a flowchart indicating a further method for practicing the invention.

In FIG. 6, an alternate program for practicing the invention is shown where a preliminary routine, such as a Power On Reset program which is performed when the machine is first turned on, tests each module and, if valid, sets an ENABLED bit in a table in a writeable memory such as the Read/Write memory to conserve the space in the CMOS memory. The steps 51, 52, 53, 57, 58, 55 and 56 are as shown in FIG. 5. The step 64, however, instead of calling the i-th program, sets the enabling bit in the enabling array, E. Later, at the appropriate place in the program, the j-th enabling bit is tested to determine whether to perform the program in the j-th module. If the enabling bit is set, then the j-th module is called as shown in the step 66.

Part of the program can also reset an enabling bit such as shown in step 67 if machine conditions indicate that the k-th program is not desired. For example, the k-th program may control a feature which is later found to be non-operational. Although the POR enabled the program, it may be disabled in light of subsequent events as shown in FIG. 6.

This is shown below in more detail in a suitable Algol program. The enabling array E is also considered to be global to the program. The steps 65 and 66 are also shown for executing the add-on program at some arbitrary location in the main program. The step 67 is also shown as resetting the enabling bit of the k-th program. It should be noted that if the k-th program were not enabled, this step would have no effect, but if it were enabled, this step will disable it. A subsequent step, of course, ought not be used to enable the program. The enabling bit is set only if the program is verified. As in the previous program, the called program checks its authorization bit. Alternatively, the authorization bit could be checked before setting the enabling bit. Such modifications would be apparent to a person of ordinary skill in the art given the teachings of this invention.

```
Boolean array A[1:n], E[1;n], . . .
  . . .
  proc. SPROG (A,E) integer i; Boolean V;
    for i:=1 step 1 until n do
      begin ver(i,V); E[i]:=V end
  end SPROG
  . . .
  go to if E[j] then #((j−1) * 2'11 + 3 * 2'12)
  . . .
  E[k]:= if (cond) then false
  . . .
```

While the invention has been particularly shown and described with reference to preferred embodiments thereof, it will be understood by those skilled in the art that various changes in form and details may be made therein without departing from the spirit and scope of the invention.

APPENDIX

Algol 60 has been used to illustrate the best mode of practicing the invention. Compilers vary from machine to machine so transliterations are allowed within the symbol set of the language. There are also translators that use the source code for one compiler to generate source code for another compiler. An Algol to Fortran translator, for example, will take the following Algol for statement for $v_1:=e_1$ step $v_2$ until $e_2$ do S
where $v_1$, $v_2$=variables,
$e_1$, $e_2$=expressions, and
S=statement (including compound statement), and generate a Fortran DO loop as follows:

```
DO 100 v₁ = e₁ TO e₂ BY v₂
S
100 CONTINUE.
```

The Algol programs included herein use lower case underlined words for the reserved words. The transliterations used include:

| DEFINITION | SYMBOL | TRANSLITERATION |
| --- | --- | --- |
| assignment operator | ← | := |
| exponentiation | ↑ | ' |
| multiplication | X | * |
| subroutine declare | procedure | proc. |
| 'not' operator | ¬ | − |

The special compiler instruction, #, indicates that an absolute address is to be compiled equal to the expression following the instruction #. For example, #(i*2'11+3*2'12) with i=3 will generate an absolute address equal to 18,432. The compiler, of course, will generate this value as called for by the object machine. If the object machine uses hexadecimal addressing, the above value will be compiled as address 4800.

Each compiler is furnished with its own library of functions such as sqrt (square root), sin (sine), arctan (arctangent), and so on, which are standard, plus special functions. The following special library functions are assumed to be provided by the compiler:

| | |
| --- | --- |
| rem (x,y) : integer routine: | supplies the remainder of the division of x by y |
| gcd (x,y) : integer routine: | supplies greatest common divisor of x and y |

What is claimed is:

1. A method for adding memory modules to an expandable memory system having a writable storage means, control bus means for conducting control signals, data bus means for conducting data signals, and address bus means for conducting signals representative of addresses, comprising the steps of:
    establishing a given boundary address value for each memory module;

coupling each added memory module to said address bus, to said data bus, and to said control bus;

providing each added memory module with valid stored data including at a first given storage location stored data representative of a predetermined reference value;

storing in said writable storage means a validity signal corresponding to each memory module in the system, said validity signal for a respective memory module having one value when said respective memory module is active and having another value when said respective memory module is inactive; and executing a program in an added memory module by a calling program comprising the steps of:
(1) checking the validity signal of a given added module,
(2) reading data from said first given storage location of said given added memory module if said validity signal indicates that the given module is active,
(3) comprising the data from step 2 to a given reference value,
(4) transferring program control to said given added module if the comparison step yields an equal result, and
(5) returning program control to a next step in the calling program after execution of the instructions in the added module.

2. The method as claimed in claim 1 including the step of providing each added memory module at a second given storage location with data representative of a check code, including an additional step after step 3 in said executing step of:
3(a) verifying the check code of the given module and modifying step (4) to
(4) transferring program control to said given added module if the comparison step yields an equal result and the verifying step verifies the check code.

3. The method as claimed in claim 2 wherein said check code represents a cyclic redundancy check character.

4. The method claimed in claim 1 wherein the first given storage location is the first addressable location in the added memory module and the stored data representative of a predetermined reference value is the first address per se of the added memory module.

5. A method for adding memory modules to an expandable memory system having a writable storage means, control bus means for conducting control signals, data bus means for conducting data signals, and address bus means for conducting signals representative of addresses, comprising the steps of:
establishing a given boundary address value for each memory module;
coupling each added memory module to said address bus, to said data bus, and to said control bus;
providing each added memory module with valid stored data including at a first given storage location stored data representative of a predetermined reference value;
storing in said first writable storage means a validity signal corresponding to each memory module in the system, said validity signal for a respective memory module having one value for a respective memory module when said respective memory module is active and having another value when said respective memory module is inactive; and
executing a program in an added memory module by a calling program comprising the steps of:
(1) verifying the stored data in said given added memory module,
(2) checking the validity signal of said given added module if the stored data is not verified,
(3) logging an error indication if said validity signal indicates said added module is active and the stored data is not verified,
(4) transferring program control to said added memory module if the stored data therein is verified,
(5) checking by said added memory program the validity signal of said added memory module,
(6) returning program control to the calling program if said validity signal indicates the added memory module is not active,
(7) executing the program in said added memory module if said validity signal indicates the memory module is active, and
(8) returning program control to the calling program at completion of the program executing step.

6. The method as claimed in claim 5 wherein step (1) of the program executing step includes:
1(a) reading data from said first given storage location,
1(b) comparing the data read in step 1(a) to a given reference value, and
1(c) indicating said predetermined reference data is verified if the comparing step produces an equal result.

7. The method as claimed in claim 5 including the addition steps of:
providing each added memory module at a second given storage location with data representing a check code, and
wherein step (1) of the program executing step includes after step 1(b) the step of
1(b)(i) comparing the check code to a derived value, and step 1(c) is modified to
1(c) indicatng said code is verified if both comparing steps produce an equal result.

8. The method as claimed in claims 5 or 6 or 7 wherein the following step is added after step (3) of the executing step
3(a) setting a flag if the stored data in the given added memory module is verified to indicate that the program in said added memory module is authorized, and
wherein step (4) is modified to (4) transferring program control to said added memory module if said flag is set.

* * * * *